United States Patent [19]

Liang et al.

[11] Patent Number: 5,604,757

[45] Date of Patent: Feb. 18, 1997

[54] MULTICHANNEL, PROGRAMMABLE LASER DIODE POWER SUPPLY, STABILIZER AND CONTROLLER

[75] Inventors: Yungfu F. Liang, Fremont; Jing J. Pan, Milpitas, both of Calif.

[73] Assignee: E-Tek Dynamics, Inc., San Jose, Calif.

[21] Appl. No.: 241,030

[22] Filed: May 10, 1994

[51] Int. Cl.$^6$ ........................................ H01S 3/10
[52] U.S. Cl. .................. 372/29; 372/34; 372/38; 372/31; 359/161; 359/154
[58] Field of Search .................. 372/29, 31, 32, 372/34, 38; 359/161, 127, 125, 154, 157, 173; 369/116, 124

[56] References Cited

U.S. PATENT DOCUMENTS

| | | | |
|---|---|---|---|
| 4,307,469 | 12/1981 | Casper et al. | 455/613 |
| 4,817,098 | 3/1989 | Horikawa | 372/31 |
| 4,918,681 | 4/1990 | Ikeda | 372/31 |
| 4,955,029 | 9/1990 | Lecoy et al. | 372/31 |
| 5,019,769 | 5/1991 | Levinson | 372/29 |
| 5,151,910 | 9/1992 | Inuyama et al. | 372/31 |
| 5,175,641 | 12/1992 | Boerstler et al. | 359/180 |
| 5,175,722 | 12/1992 | Minami et al. | 369/116 |

OTHER PUBLICATIONS

"Analog Laser Diode Power Supply & Stabilizer", product brochure of Advanced Optronics, Inc., San Jose, CA. (no date available).

"The LDX-3620", product brochure of ILX Lightwave Corp., Bozeman, MT. (no date available).

*Primary Examiner*—Rodney B. Bovernick
*Assistant Examiner*—Yisun Song
*Attorney, Agent, or Firm*—Townsend and Townsend and Crew LLP

[57] ABSTRACT

A system for controlling the operation of multiple laser diodes in a noise free and efficient manner. The system includes a control module that generates control signals to control and regulate the multiple laser diodes, and an input/output module that allows control parameters to be selected and set by a user. Each individual laser diode is stabilized and regulated by its own individual laser diode driver module that includes current, power, and temperature regulation systems to ensure the operating parameters of each laser diode are accurately maintained. Each laser diode driver module also measures key operating parameters to allow the control module to monitor system operation and switch malfunctioning diodes off. All analog-to-digital conversions of each diode's operating parameters are performed by digital circuitry within the control module, which is physically separated from the laser diode driver modules to minimize interference that is typically caused by the digital switching. To further minimize digital switching interference, all digital portions of each laser diode driver module transmit digital signals on a different layer within the laser diode driver module that analog signals are transmitted on.

9 Claims, 10 Drawing Sheets

MULTICHANNEL, PROGRAMMABLE LASER DIODE POWER SUPPLY, STABILIZER AND CONTROLLER

BACKGROUND OF THE INVENTION

The present invention relates to laser diodes. More specifically, the present invention relates to a power supply and control system that regulates and stabilizes the operating conditions of multiple laser diodes.

With the growing importance of fiber optic communication systems and optical memory devices, laser diodes are now one of the most common active devices. In fiber optic communication systems, laser diodes are used as signal transmission components that transmit multi-megabit/second digital data, by being turned ON and OFF at very high data rates to generate the required optical representation of the electrical signal inputs to be conveyed over a fiber optic highway to a repeater or receiver station. Laser diodes are greatly preferred over light emitting diodes in these communications systems because of their ability to operate at extremely high frequencies and transmit data at high rates.

In operating at such high frequencies, however, the light emitted from laser diodes can vary considerably in response to current and power fluctuations, temperature fluctuations, voltage spikes, and aging. Even small variations in these operating parameters can translate to an unacceptable level of noise and impair the laser diode's functionality. Thus, laser diodes require stable external parameters in order to operate properly over long periods of time.

The most important external parameters for proper laser diode functioning are operating current, power and temperature. Consequently, it is of particular importance that the system driving a laser diode include some sort of means that regulates and stabilizes these parameters. This is especially true if the laser diode is undergoing characterization studies, reliability and burn-in production testing, or accelerated life testing before being employed in an optic communication system.

To lessen the effects of these variations, laser diode control systems typically regulate parameters such as the operating current, power, and temperature of the diode. Operating current and power, respectively, are regulated by measuring the current passing through the laser diode output and its operating power level and comparing the measured value to a reference signal. The difference between the reference signal and measured value are used to automatically adjust the operating current or power of the laser diode. Similarly, the laser diode's operating temperature can be regulated by measuring the operating temperature with a temperature sensitive resistor and using a Peltier effect element to heat or cool the diode as necessary.

In controlling the operating parameters it is useful to use a digital processing system such as a personal computer to set the appropriate reference parameters, report on and monitor operating conditions, and adjust diode activity. If the operating parameters of a laser diode become too unstable at any given point, the digital processing system can shut the diode or the entire system off. Prior art control systems based on digital electronics, however, disadvantageously introduce voltage noise that is inherently created by the digital switching processes in the control devices themselves. This voltage noise is passed on to the laser diode and contributes to instable operation which is precisely the fault the digital control system is meant to correct.

It is also practical to drive multiple laser diodes with a single power supply. However, in using a single power supply, extra noise arises from high current required to drive and control the various chips associated with multiple laser diodes. The high current causes interference between parts of the device controlling the individual laser diodes and disrupts diode operation.

SUMMARY OF THE INVENTION

The present invention solves the problems of the prior art by providing a system which drives multiple laser diodes in a noise free and efficient manner.

In one embodiment of the present invention, a control module allows for the control and regulation of multiple laser diodes, and an input/output module allows control parameters to be selected and set by a user. Each individual laser diode is stabilized and regulated by its own individual laser diode driver module that includes current, power, and temperature regulation systems, which ensure the operating parameters of each laser diode are accurately maintained. Each laser diode driver module also measures key operating parameters to allow the control module to monitor system operation and switch malfunctioning diodes off.

In this embodiment, all analog-to-digital conversions of each diode's operating parameters are performed by digital circuitry within the control module, and the control module is physically separated from the laser diode driver modules. Physically separating all analog-to-digital conversion from the laser diode minimizes interference that is typically caused by the digital switching. To further minimize digital switching interference, all digital portions of each laser diode driver module transmit digital signals on a different layer within the laser diode driver module that analog signals are transmitted on.

The features and advantages of a laser diode control system according to the present invention will be more clearly understood from the following description taken in conjunction with the accompanying drawings.

DESCRIPTION OF THE PREFERRED EMBODIMENT

TABLE OF CONTENTS

Figure 1:
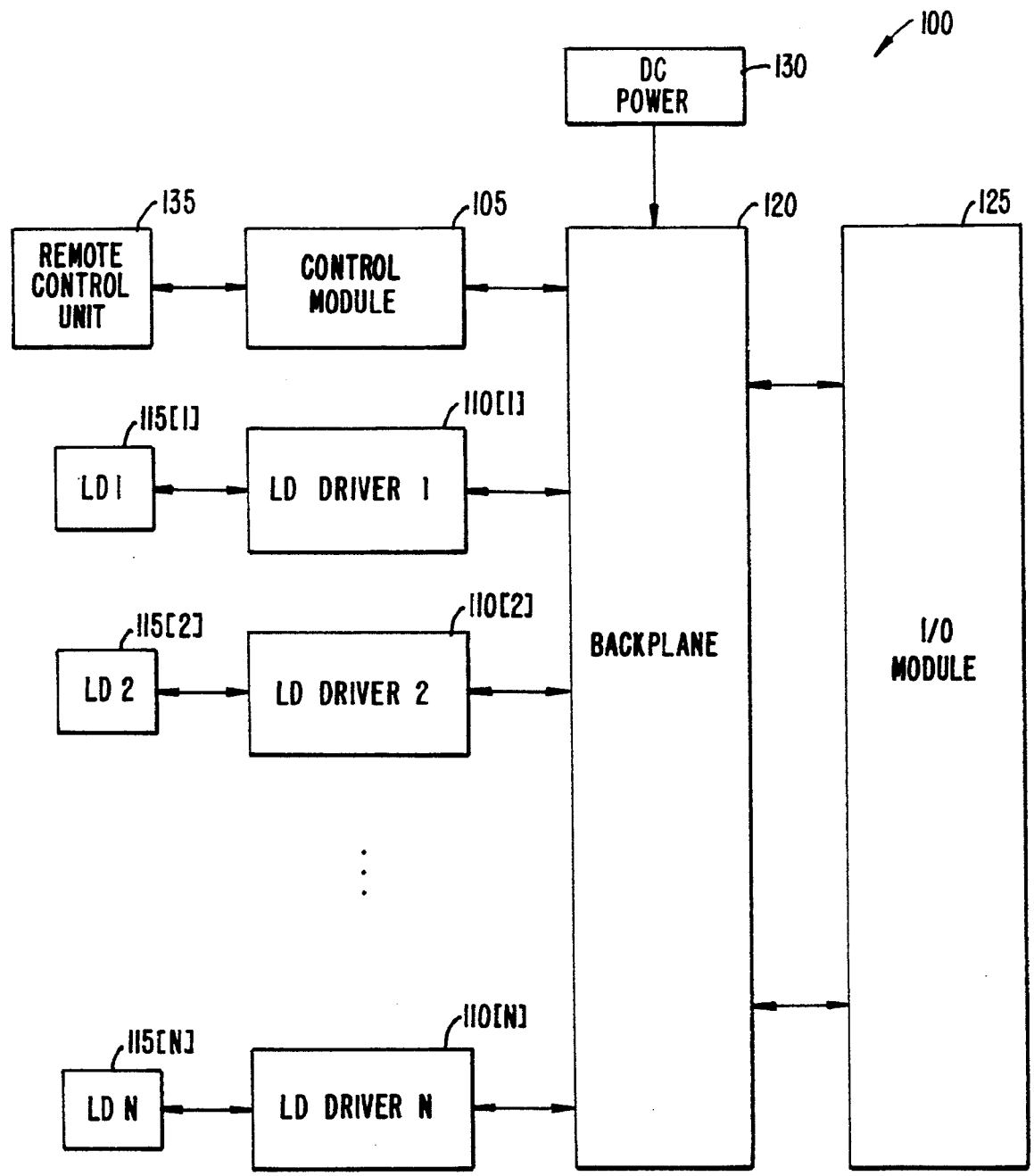
FIG. 1 is a block diagram of one embodiment of a laser diode controller system according to the present invention.

I. Overview of the Laser Diode Controller System
II. Details of Individual Components
  A. Input/Output Device
  B. Control Module
  C. Laser Diode Driver Modules
    1. FPGA
    2. Signal Modulation
    3. Current/Power Stabilizer and Regulator
    4. Temperature Stabilizer and Regulator
    5. Multilayered Approach
  D. Laser Diode
III. Operation of the System
  A. Changing Laser Diode Parameters
    1. Operating Current
    2. Operating Power
    3. Operating Temperature
  B. Other Commands I. Overview of the Laser Diode Controller System FIG. 1 is a block diagram of a laser diode controller system 100 according to the present invention. Laser diode controller 100 includes a control module 105 for controlling the laser diode system, a plurality of laser diode driver modules 110[1] ... 110[N] for driving up to N laser diodes 115[1] ... 115[N] on separate channels, a backplane 120 for transferring data, control, and address signals between the modules, a local input/output module 125 for allowing input and output to the controller system, a DC power supply 130 for supplying power to laser diodes 115[1] ... 115[N], and a remote control unit 135 for controlling the laser diode system remotely.

Control module 105, plurality of laser diode driver modules 110[1] ... 110[N], and input/output module 125 are all connected to backplane 120. Backplane 120 is a data and address bus system that transmits both digital and analog signals between the modules. Backplane 120 also carries the DC power supply signal from DC power supply 130 to each module.

Each individual laser diode driver module 110[I] is coupled to a respective laser diode 115[I] and switches the laser diode ON and OFF at a frequency set by control module 105. Control signals setting the operation parameters for each laser diode 115[I] are also sent from control module 105 to laser diode driver module 110[I] over backplane 120. Each individual driver module 110[I] sets and maintains operation of laser diode 115[I] at these parameters.

Control module 105 is also connected to remote control unit 135 which allows remote control unit 135 to take over the functions of and replace input/output unit 125. Remote control unit 135 may be a personal computer or any other digital processing device.

II. Details of Individual Components
A. Input/Output Module 125

Figure 2:
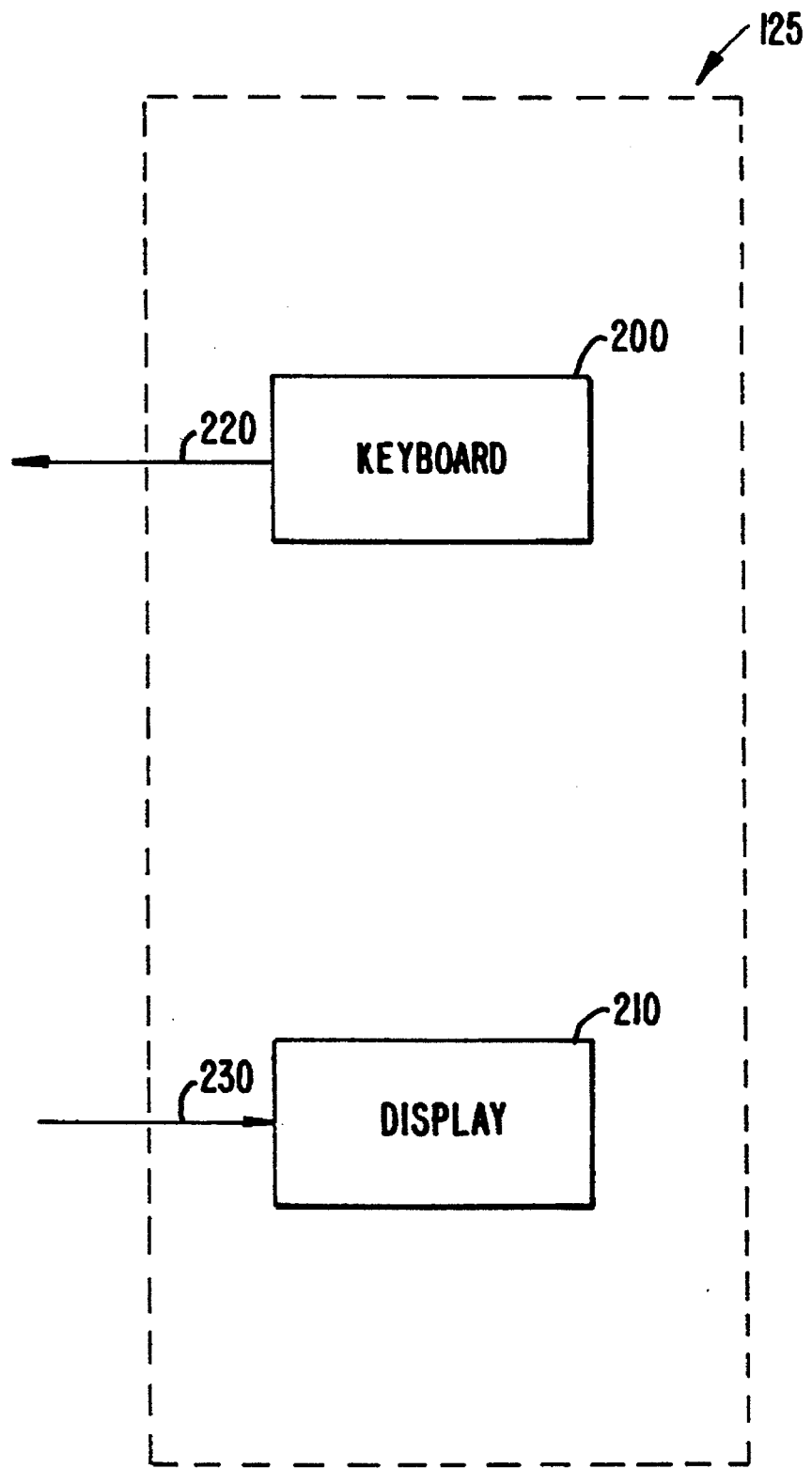
FIG. 2 is a block diagram of one embodiment of the input/output module shown in FIG. 1.

FIG. 2 is a block diagram of input/output module 125. Input/output module 125 includes a keypad 200 and a display 210. A user can enter operational and control information for laser diodes through keypad 200. The control information is passed to control module 105 through a communication channel 220 and then through backplane 120. Measured operating parameters such as the current operating temperature, current, or power can be displayed on display 210, which is a vacuum fluorescent display, from signals sent over backplane 120 and through a communication channel 230.

B. Control Module 105

Figure 3:
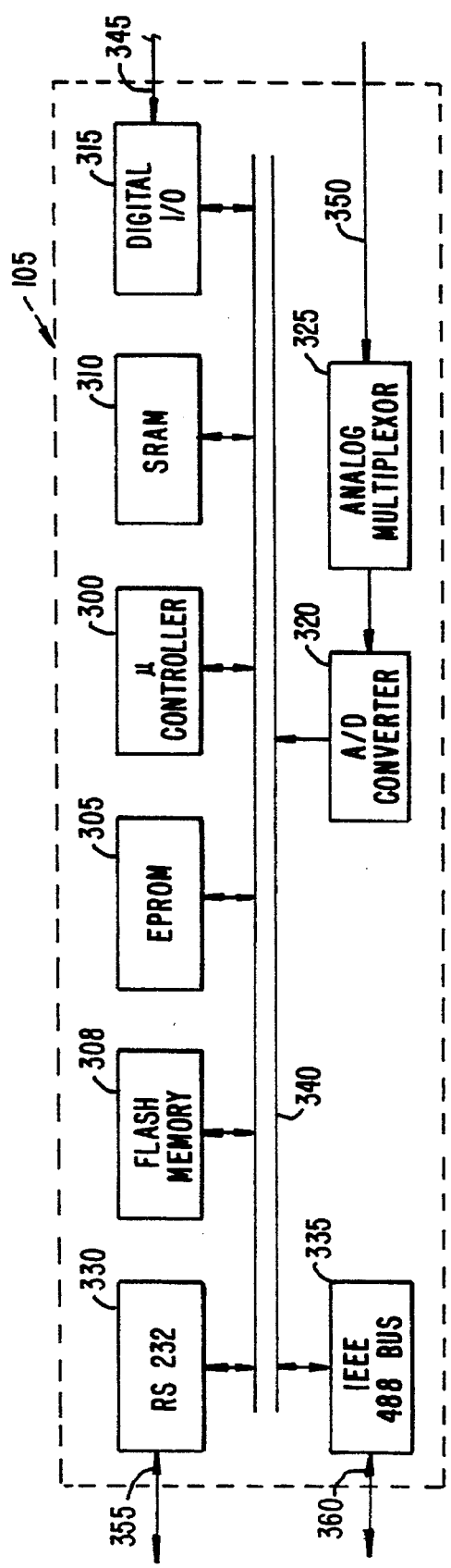
FIG. 3 is a block diagram of one embodiment of the control module in FIG. 1.

FIG. 3 is a block diagram of one embodiment of control module 105 shown in FIG. 1. Control module 105 includes a microcontroller 300, an EPROM memory 305 for storing program code executed upon power-up, a flash memory 308 for storing user changeable calibration data, a memory 310 for storing program data and operating data, a digital input/output circuit 315 for controlling digital communication with backplane 120, an analog-to-digital converter 320 for converting analog signals received from backplane 120 to digital signals that can be processed by microcontroller 300, an analog multiplexer 325 for selecting which laser diode's analog output is input to analog-to-digital converter 320, a serial interface 330 for allowing serial communication to a remote computer, and an IEEE 488 interface 335, also for allowing communication with a remote computer. All of the various components of control module 105 are connected to an internal bus 340 which allows communication between the components.

Microcontroller 300 is a Hitachi HD64180 chip that is the brains of control module 105. Memory 310 is a 64K SRAM chip that stores the operation settings for each laser diode as input by a user through keypad 200 or as set by remote control unit 135, and EPROM memory 305 and Flash memory 308 are also 64K memories.

Digital input/output circuit 315 sends and receives digital data, control signals, and address signals between control module 105 and backplane 120 over a communication channel 345. Similarly, a communication channel 350 transmits analog signals (measured operating parameters) between each laser diode driver module 110[I] and N-to-1 analog multiplexer 325 over backplane 120. Analog multiplexer 325 selects which of the N laser diode channels analog data is converted to digital data for by Analog-to-digital converter 320 in response to a control signal generated by microcontroller 300.

A remote computer can be connected to control module 105 through either RS 232 serial interface 330 or IEEE 488 interface 335. If serial interface 330 is used, a communication path 355 transmits signals between the remote computer and control module 105, while if IEEE 488 interface 335 is used, a communication path 360 transmits signals between the remote computer and control module 105.

C. Laser Diode Driver Modules 110[I]

Figure 4:
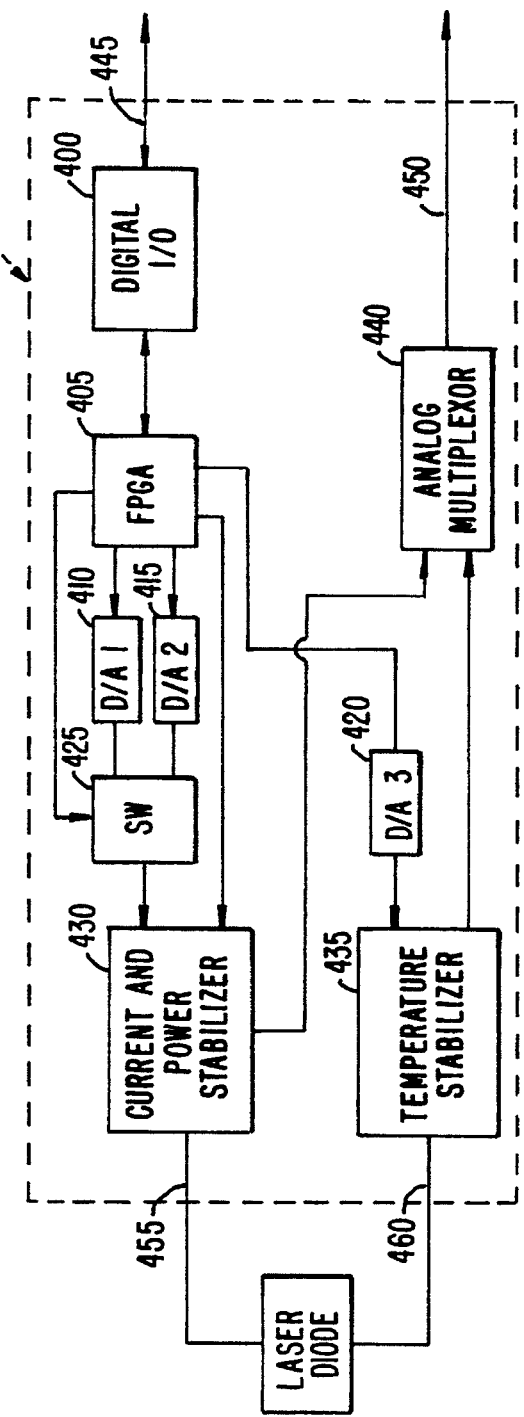
FIG. 4 is a block diagram of one embodiment of one of the laser diode driver modules shown in FIG. 1.

FIG. 4 is a block diagram of one embodiment of one of laser diode driver modules 110[1] ... [N] shown in FIG. 1. Each laser diode driver 110[1] ... 110[N] is identical, therefore only the construction of a laser diode driver 110[I] is described in detail.

Laser diode driver 110[I] includes a digital input/output circuit 400 for controlling digital communication with backplane 120; a field programmable gate array (FPGA) chip 405 for controlling the functionality of laser diode driver 110[I]; digital-to-analog converters 410, 415, and 420 for converting digital output signals from FPGA 405 into analog signals; switch 425 for selecting to output either the output of digital-to-analog converter 410 or digital-to-analog converter 415; current and power control circuit 430 for regulating either the current or power supplied to the laser diode; temperature control circuit 435 for regulating the operating temperature of the laser diode, and analog multiplexer 440 for one of the various measured operating parameters to report to control module 105.

Digital input/output circuit 400 controls the exchange of digital data, control signals, and address signals between laser diode driver module 110[I] and backplane 120 over a communication channel 445. The measured operating parameters of laser diode 115[I] are transmitted as analog signals to analog multiplexer 440, which selects which signals to send to backplane 120 via a signal path 450. The measured parameters are monitored by control module 105, which can initiate a system shutdown if any of the parameters are outside safe operating ranges. In the preferred embodiment these operating parameters include the operating temperature, current level, and power level of the front and back facet of laser diode 115[I], bias voltage across the laser diode, current limit, and regulated DC voltages among other parameters. Of course, other embodiments may include various subsets or supersets of these parameters depending on design preferences. All signals are multiplexed locally so that there is only one analog output from laser diode driver module 110[I] to back plane 120. The N analog outputs from laser diode driver modules 110[1] . . . 110[N] are again multiplexed by multiplexer 325 so that there is only one input to A/D converter 320. This arrangement reduces the amount of noise in the entire system.

1. FPGA

FPGA 405 is a field programmable gate array chip, TPC 1010A, manufactured and distributed by Texas Instruments. The TPC 1010A chip is a low power CMOS chip that minimizes the current that must be sent over backplane 120 to drive each laser diode driver module 110[1] . . . 110[N] and thus minimizes noise caused by high current interference.

Figure 5:
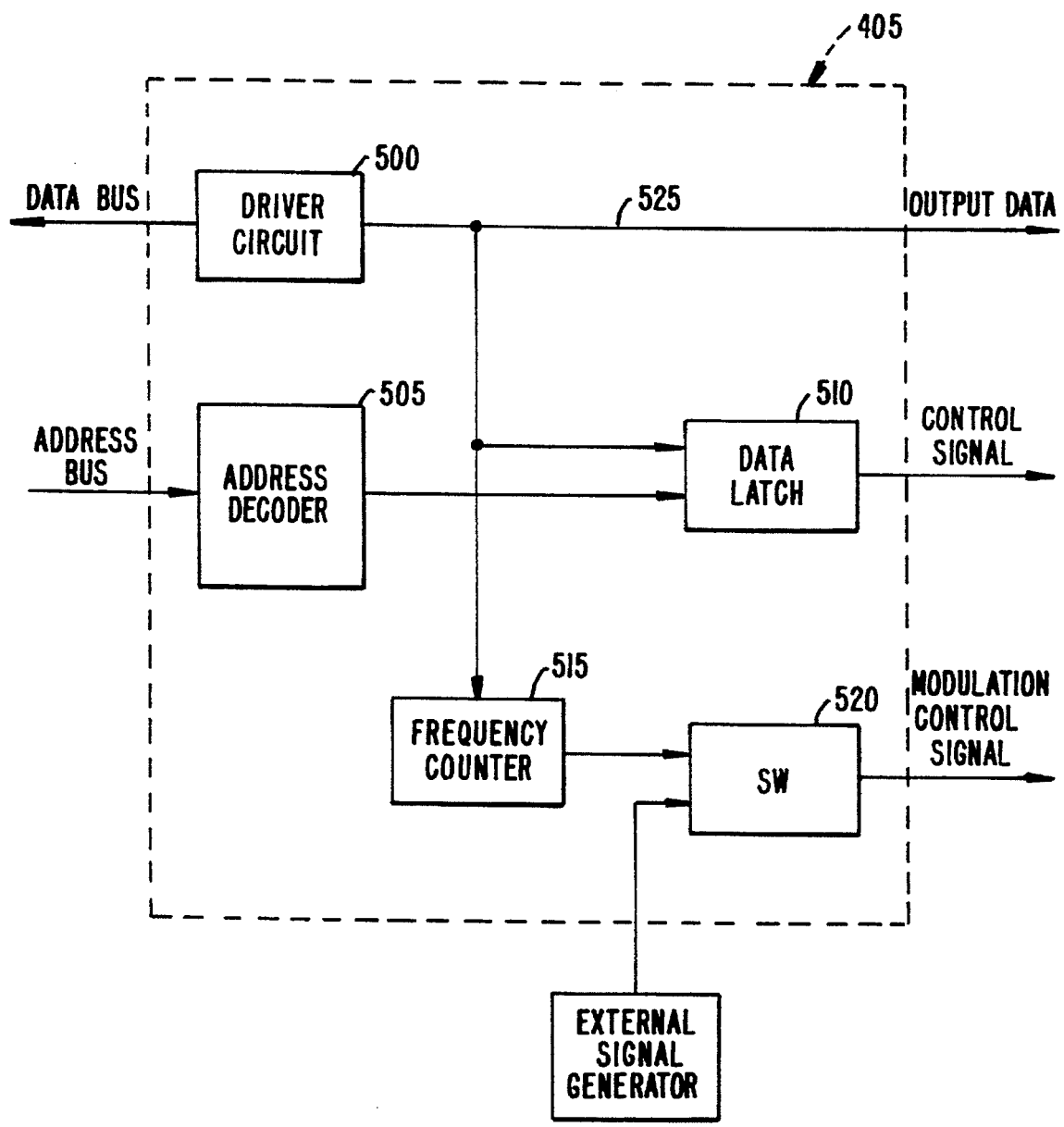
FIG. 5 is a block diagram of one embodiment of the field programmable gate array shown in FIG. 4.

A more detailed description of FPGA 405 is shown in FIG. 5, which is a block diagram of one embodiment of FPGA 405. FPGA 405 includes a driver circuit 500 for driving its internal circuitry, an address decoder 505 for decoding address signals, a data latch 510 for latching and storing control signals, a frequency counter 515 for setting the modulation frequency of laser diode 115[I], a switch 520 for selecting internal modulation or external modulation signal, and an internal bus 525 for transmitting control and data signals between the various components of FPGA 405.

Driver circuit 500 appears as a single load to DC power supply 130 and operates off a small current level. Driver circuit 500, however, is able to drive all the circuitry within FPGA 405 and laser diode driver module 110[I]. Address decoder 505 decodes the address signal sent from control module 105 to laser diode driver module 110[I] and determines if data sent over backplane 120 is addressed to laser diode driver module 110[I] by performing address comparisons in a manner well known to those skilled in the art.

When address decoder 505 determines the data sent over backplane 120 is addressed to laser diode driver module 110[I], appropriate control signals are sent to data latch 510 to load control signals from internal bus 520 or sent to frequency counter 515 to load a frequency control signal from internal bus 120.

The control signals latched in data latch 510 include a current/power mode select signal, a select signal for analog multiplexer 440, and a select signal for switch 520, which selects between using the signal generated by frequency counter 515 or an external signal generator as a modulation control signal for laser diode 115[I].

Frequency counter 515 inputs a digital frequency control signal from bus 525 in response to a select signal output from address decoder 505. The frequency control signal specifies the frequency at which frequency counter 515 produces and outputs a modulation signal input to switch 520. Also input to switch 520 is a modulation signal from an external signal generator. In normal operation, the switch select signal sent to switch 520 selects the output of frequency counter 515 as the modulation signal. The external signal generator, however, allows for increased flexibility in operation such as a variable duty cycle.

2. Signal Modulation

Figure 6A:
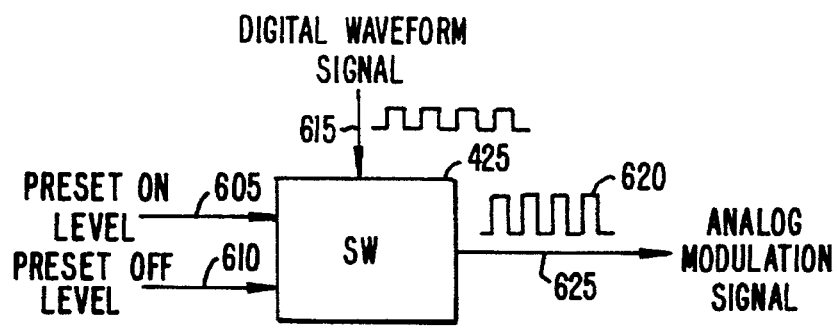
FIG. 6A is a block diagram showing the inputs and output from one embodiment of the modulation switch shown in FIG. 4.

The output from switch 520 is input as a digital waveform signal to control the output of switch 425 and the operating frequency of laser diode 115[I]. A detailed description of this modulation system can be best understood in conjunction with FIG. 6A, which is a block diagram showing the inputs and output of switch 425 and FIG. 6B, which is a diagram showing the analog waveform output from switch 425.

Switch 425 receives first and second inputs over signal paths 605 and 610, respectively, which control the ON and OFF current levels of laser diode 115[I]. The voltage level set on signal path 605 controls the "high" or ON current level output from switch 425, while the voltage level set on signal path 610 controls the "low" or OFF current level output from switch 425. Both the ON and OFF current levels are set by digital signals output from FPGA 405 on its data output lines. The output digital signals are converted to analog signals by digital-to-analog converters 410 and 415. Digital-to-analog converter 410 converts the digitally encoded preset ON current level to its analog level, and digital-to-analog converter 415 converts the digitally encoded preset OFF current level to its analog equivalent.

Switch 425 also receives the modulation control signal from FPGA 405 as output from switch 520 to a signal path 615. The modulation control signal rapidly switches the output of switch 425 between the preset ON and OFF current levels set on signal paths 605 and 610, respectively. The output of switch 425 is analog modulation signal 620 output to a signal path 625.

Figure 6B:
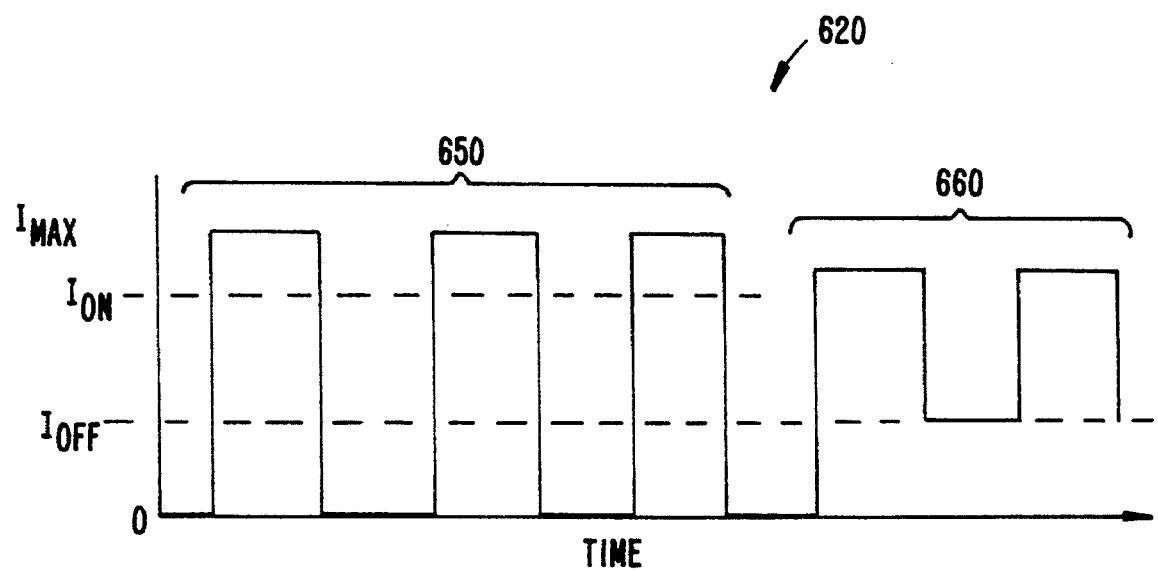
FIG. 6B is a diagram showing the modulated analog output waveform from the switch shown in FIG. 6A.

When the voltage control settings set on signal paths 605 and 610 are set to maximum laser diode current ($I_{max}$) and minimum laser diode current ($I_{min}$=0 Amps) levels, analog modulation signal 620 pulsates between those levels as shown during time period 650 in FIG. 6B. When the current control settings set on signal paths 605 and 610 are set to preset levels different than $I_{max}$ and $I_{min}$, analog modulation signal 620 pulsates between the preset levels as shown during time period 660 where the preset ON level received over signal path 605 is $I_{ON}$ while the preset OFF level is $I_{OFF}$.

The ON level of analog modulation signal 620 can be set to $I_{max}$ while the OFF level is set to an intermediate value, $I_{OFF}$, or the OFF level can be set to $I_{min}$ while the ON level is set to an intermediate value $I_{ON}$. The flexibility offered by this approach is immense, and in fact, analog modulation signal 620 can be set to pulsate between any ON and OFF levels within the operating range of laser diode 115[I] using this control method.

3. Current/Power Stabilizer and Regulator

Figure 7:
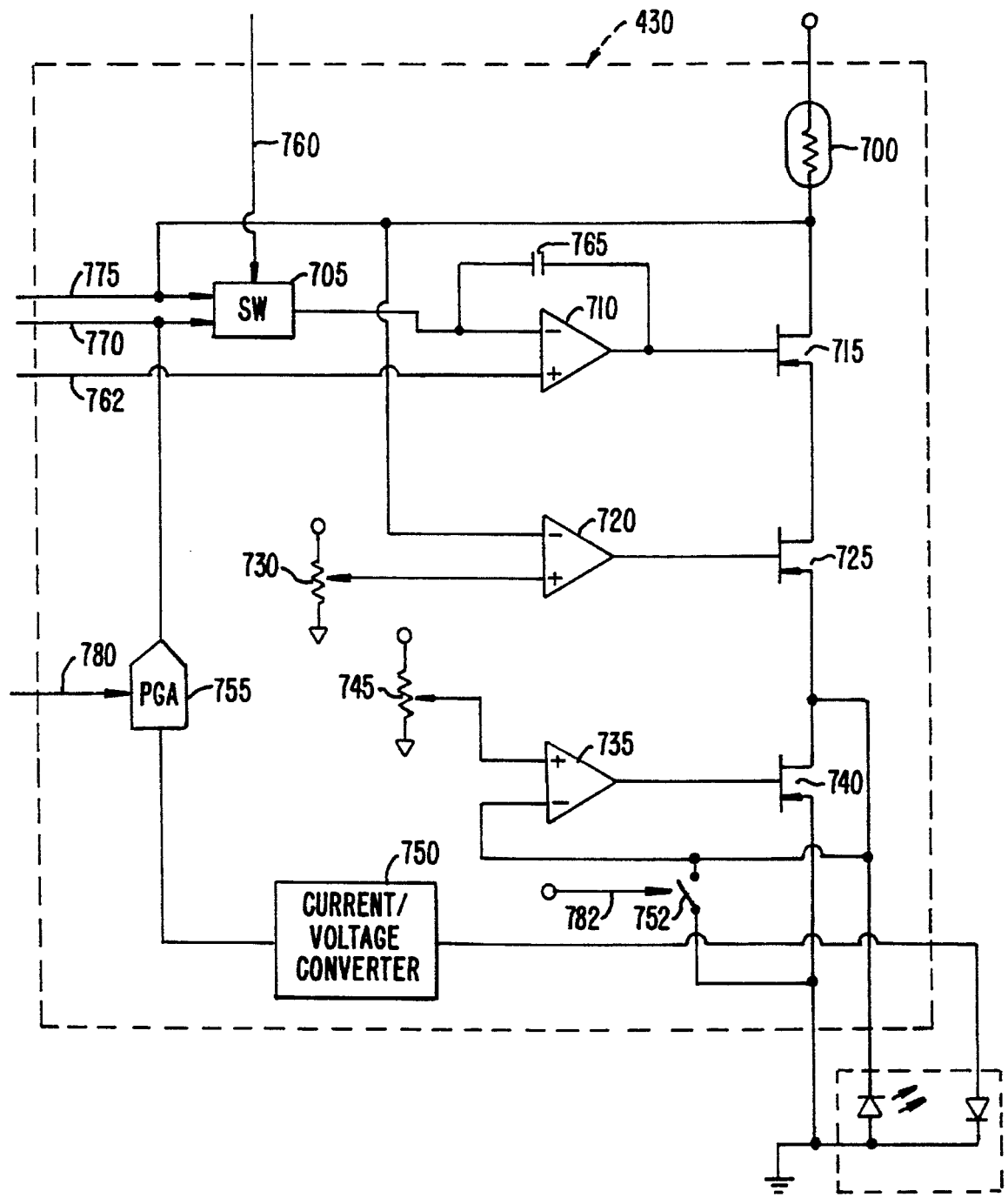
FIG. 7 is a block diagram of one embodiment of the current and power regulator shown in FIG. 4.

FIG. 7 is a block diagram of one embodiment of current and power regulator 430 shown in FIG. 4. Current and power regulator 430 includes a current sensing resistor 700 which is insensitive to temperature, a switch 705 for controlling whether constant current or constant power is regulated by current and power regulator 430, a differential amplifier 710 for adjusting the current or power output of laser diode 115[I], a MOSFET power transistor 715, a differential amplifier 720 for limiting the maximum amount of current that laser diode 115[I] operates on, a MOSFET power transistor 725, a variable resistor 730 for setting the maximum amount of current laser diode 115[I] operates on, a differential amplifier 735 for limiting the maximum voltage that laser diode 115[I] operates at, a MOSFET power transistor 740, a variable resistor 745 for setting the maximum voltage that differential amplifier 735 limits laser diode operation to, a current-to-voltage converter 750 for converting the measured light (photodetector current) output of laser diode 115[I] to a voltage measurement, a programmable gain amplifier (PGA) 755 for amplifying the output of current-to-voltage converter 750, and a bypass relay 752.

Current and power regulator 430 performs four primary functions: (1) it stabilizes either the operating current or power of laser diode 115[I]; (2) it limits the maximum operating current of the laser diode; (3) it limits the maximum voltage across laser diode 115[I]; and (4) protects the laser diode during the power-up and power-down by using bypass relay 752.

Figure 10:
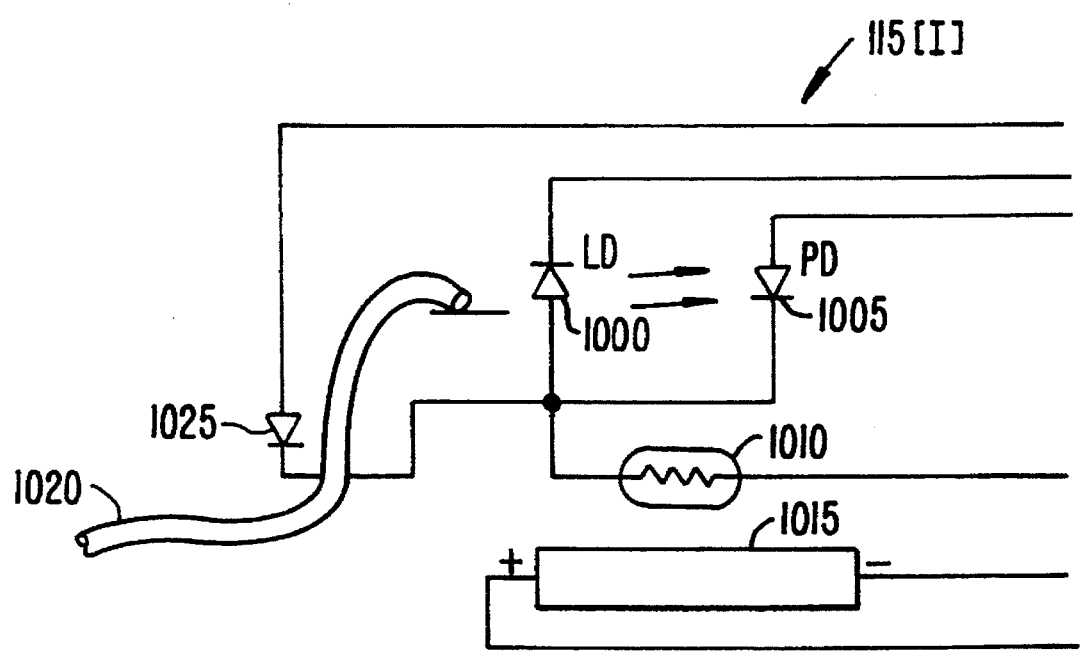
FIG. 10 is a block diagram of one of the laser diodes shown in FIG. 1.

In stabilizing the operating current or power of laser diode 115[I], a control signal sent from FPGA 405 over a communication path 760 selects whether switch 705 outputs the current passing through laser diode 115[I], or the measured power level of laser diode 115[I] as detected by a photodetector, which is described in relation to FIG. 10. To stabilize operating current, switch 705 is set to output the current level from signal path 775 to differential amplifier 710, while to stabilize operating power, switch 705 is set to output the power level from signal path 770 to differential amplifier 710.

The operating current on signal path 775 is the same current level passing through current sensing resistor 700 and laser diode 115[I]. The operating power level on signal path 770 is set by current-to-voltage converter 750, which inputs the current output from the anode of photodetector 115 and converts it to a voltage level, and PGA 755, which amplifies the output of current-to-voltage converter 750. The gain of PGA 755 is controlled by a signal sent from FPGA 405 over a communication path 780.

Differential amplifier 710 inputs the output of switch 705 at its summing junction and inputs the desired current or power setting from FPGA 405 over a signal path 762 at its reference junction. The difference between the two signals is output to the gate of MOSFET power transistor 715, which adjusts the actual operating current or power to match the reference level set on signal path 762. A capacitor 765 is coupled between the output and summing junction of differential amplifier 710 to provide slow start and prevent noise from damaging laser diode 115 upon start-up.

Signal path 770 also carries the measured operating power level to analog multiplexer 440, and signal path 775 carries the operating current to analog multiplexer 440.

The maximum current setting for laser diode 115 is set by variable resistor 730. The resistance of variable resistor 730 is controlled by a knob on laser diode driver 110[I]. Of course, one skilled in the art will recognize many equivalent ways to set maximum current level. Differential amplifier 720 inputs the maximum current level at its reference junction and the current level over laser diode 115[I] at its summing junction. The output of differential amplifier 720 is input to MOSFET power transistor 725 which limits the maximum current level of laser diode 115[I] to the level set by variable resistor 730.

The maximum voltage across laser diode 115 is set by variable resistor 745 and controlled by a differential amplifier 720. The resistance of variable resistor 745 is controlled by a knob on laser diode driver 110[I]. Differential amplifier 735 is connected to variable resistor 745 at its reference junction and is connected to the cathode of laser diode 115[I] at its summing junction. The output of differential amplifier 720 is connected to the anode of laser diode 115[I] through MOSFET power transistor 740, which limits the maximum voltage level across the diode to the level set by variable resistor 745.

Bypass relay 752 receives a control signal over a communication path 782 from FPGA 405. The control signal is generated by microcontroller 300 and protects the laser diode during power-up and power-down by opening bypass relay 752. Bypass relay 752 can also be opened by microcontroller 300 to protect the laser diode if microcontroller 300 detects that any of the laser diode's operating parameters are outside of acceptable ranges.

4. Temperature Regulator

Figure 8:
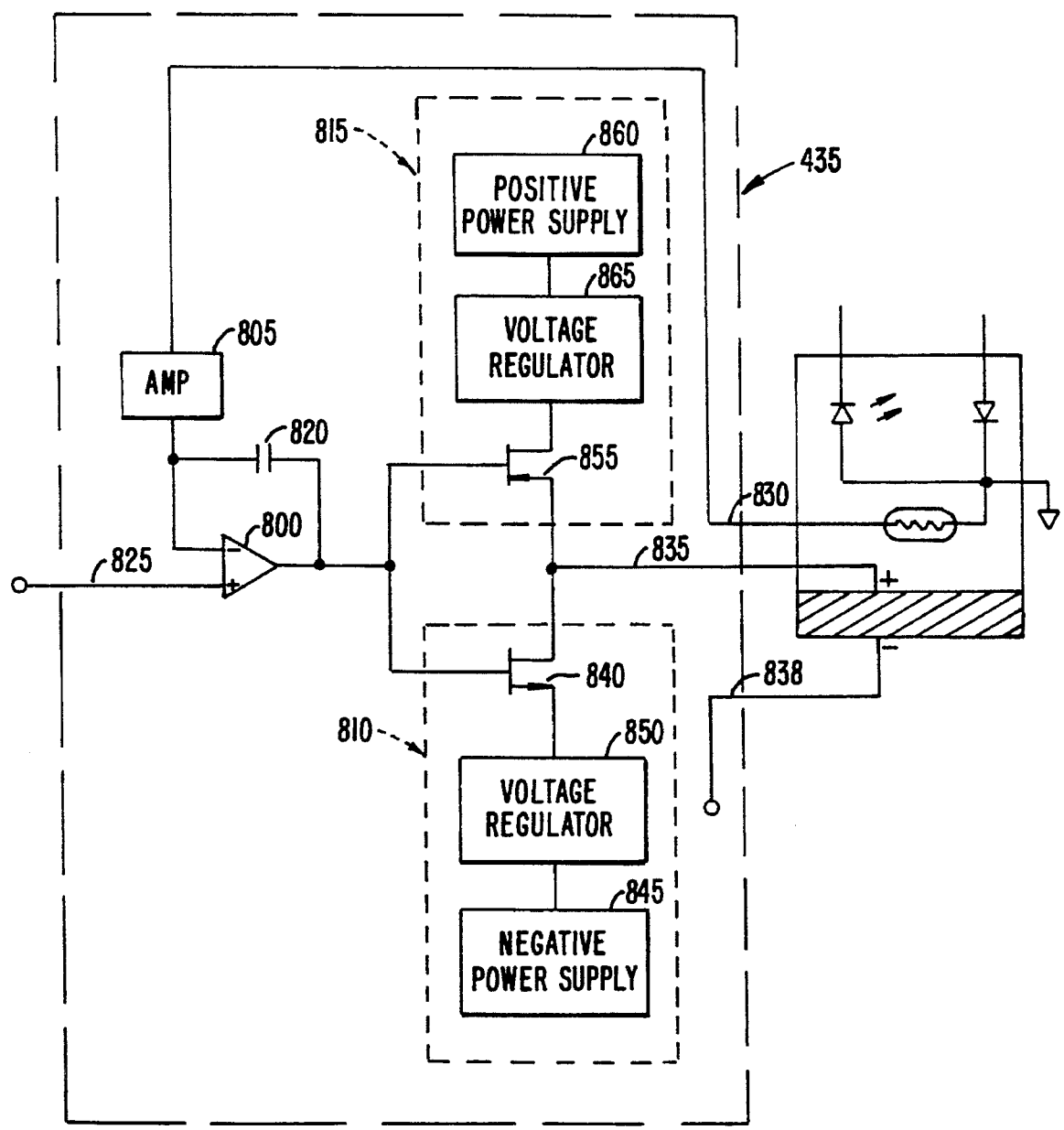
FIG. 8 is a block diagram of one embodiment of the temperature regulator shown in FIG. 4.

FIG. 8 is a block diagram of one embodiment of temperature regulator 435 shown in FIG. 4. Temperature regulator 435 includes an operational amplifier 800 for comparing the desired operating temperature against the measured operating temperature of laser diode 115[I], a bridge amplifier 805 for amplifying the measured temperature of laser diode 115[I], a heating system 810 for increasing the operating temperature of laser diode 115, a cooling system 815 for decreasing the operating temperature of laser diode 115, and a capacitor 820 for controlling how quickly temperature regulator 435 reacts to operating temperature changes.

The desired operating temperature of laser diode 115 is set by a signal input to the reference junction of operational amplifier 800 from digital-to-analog converter 420 over a signal path 825. The actual operating temperature of laser diode 115[I] is measured by a temperature sensitive resistor (thermistor) placed near the laser diode. A signal path 830 carries the measured operating temperature to amplifier 805, which is a bridge amplifier that amplifies the measured operating temperature and inputs it to the summing junction of operational amplifier 800.

The difference, if any, between the desired operating temperature and actual operating temperature is output from operational amplifier 800 to heating system 810 and to cooling system 815. If the difference indicates that laser diode 115 is operating at a temperature below the desired operating temperature, heating system 810 outputs a signal over a signal path 835 causing a Peltier effect element (thermal electric cooler) to increase the operating temperature of laser diode 115. The Peltier effect element is connected to a digital ground through a signal path 838 and backplane 120.

In heating system 810, transistor 840 is an FET power transistor which controls whether a signal from a negative power supply 845 is supplied to the Peltier effect element to decrease the operating temperature of the laser diode. A voltage regulator 850 regulates the negative voltage supplied to the Peltier effect element.

If the difference between the measured and desired operating temperature of the laser diode indicates that it is operating at a temperature above the desired operating temperature, cooling system 815 outputs a signal over a signal path 835 causing the Peltier effect element to decrease the operating temperature of laser diode 115.

In cooling system 815, transistor 855 is an FET power transistor which controls whether a signal from a positive power supply 860 is supplied to the Peltier effect element to increase the operating temperature of the laser diode. A voltage regulator 865 regulates the positive voltage supplied to the Peltier effect element.

5. Multilayered Approach

Some digital control signals must be converted to their analog signal equivalent on laser diode driver 110[I]. Several design features of laser diode driver 110[I] drastically reduce any interference noise that is caused by such signal conversion. First, all digital portions of laser diode driver 110[I] (i.e., digital input/output circuit 400, FPGA 405, and digital-to-analog converters 410, 415, and 420) are all positioned at an opposing end of laser diode driver module 110[I] from the end on which analog portions (i.e., switch 425, current and power regulator 430, and temperature regulator 435) are situated.

Figure 9:
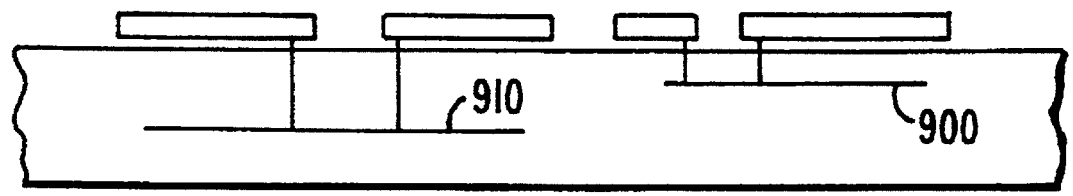
FIG. 9 is a cross section side view of one embodiment of one of the laser diode driver modules shown in FIG. 4.

Additionally, the circuit board holding the various portions of laser diode driver module 110[I] includes multiple signal transmission layers as shown in FIG. 9, which is a cross section side view of one embodiment of a portion of laser diode driver module 110[I]. All digital signals are transmitted between components on a first layer 900. A second layer 910, below layer 900, is used to transmit all analog signals on laser driver module 110[I]. Those of skill in the art will recognize that the first layer may be below the second layer in other embodiments of the present invention and that more than two signal transmission layers may be utilized in still further embodiments.

D. Laser Diode Module

FIG. 10 is a circuit diagram of one embodiment of laser diode module 115[I] as shown in FIG. 1. Laser diode module 115[I] includes a laser diode 1000 for sending optic communication signals, a photo detector 1005 for monitoring the output of laser diode 1000, a thermistor 1010 for monitoring the operating temperature of laser diode 1000, a Peltier effect element for increasing and decreasing the operating temperature of laser diode 1000, a fiber optic cable for transmitting optic communication signals generated by laser diode 1000, and a photo detector 1025 for monitoring the output of laser diode 1000 as transmitted over fiber optic cable 1020.

Photo detector 1005 is disposed in direct proximity to laser diode 1000 so that photo detector 1005 adequately detects the operation of laser diode 1000. Peltier effect element 1015 is also situated near laser diode 1000 to better adjust the operating temperature of the diode if necessary. Fiber optic cable 1020 has one end positioned directly next to laser diode 1000 so the photo output of the diode is transmitted along the cable. The end of the cable must be positioned such that the angle between the cable and laser diode 1000's output is minimized; otherwise, light emitted from laser diode 1000 would not adequately be transmitted along fiber optic cable 1020.

The photo detector 1025 is positioned at a point along fiber optic cable 1020 such that it detects the signal transmitted along cable 1020.

III. Operation of Laser Diode Control System 100

As previously mentioned, laser diode control system 100 is used in operation to set, monitor, and regulate operating parameters and conditions of laser diodes 115[1] . . . 115[N].

A. Setting and Regulating Operation Parameters

The parameters that can be set by a user include the operating temperature and the operating current or the operating power of each individual laser diode 115[1] . . . [N] Once the parameters are set for laser diode 115[I], laser diode control system 100 monitors the operation of the laser diode to ensure it is maintained exactly at the set levels. Each laser diode 115[1] . . . [N] is monitored so that each diode is maintained at a constant operating temperature and either a constant operating current or power level depending on whether the current regulation or power regulation mode is selected. These parameters may be set either directly through the use of keypad 200 or indirectly by remote control unit 135.

Figure 11:
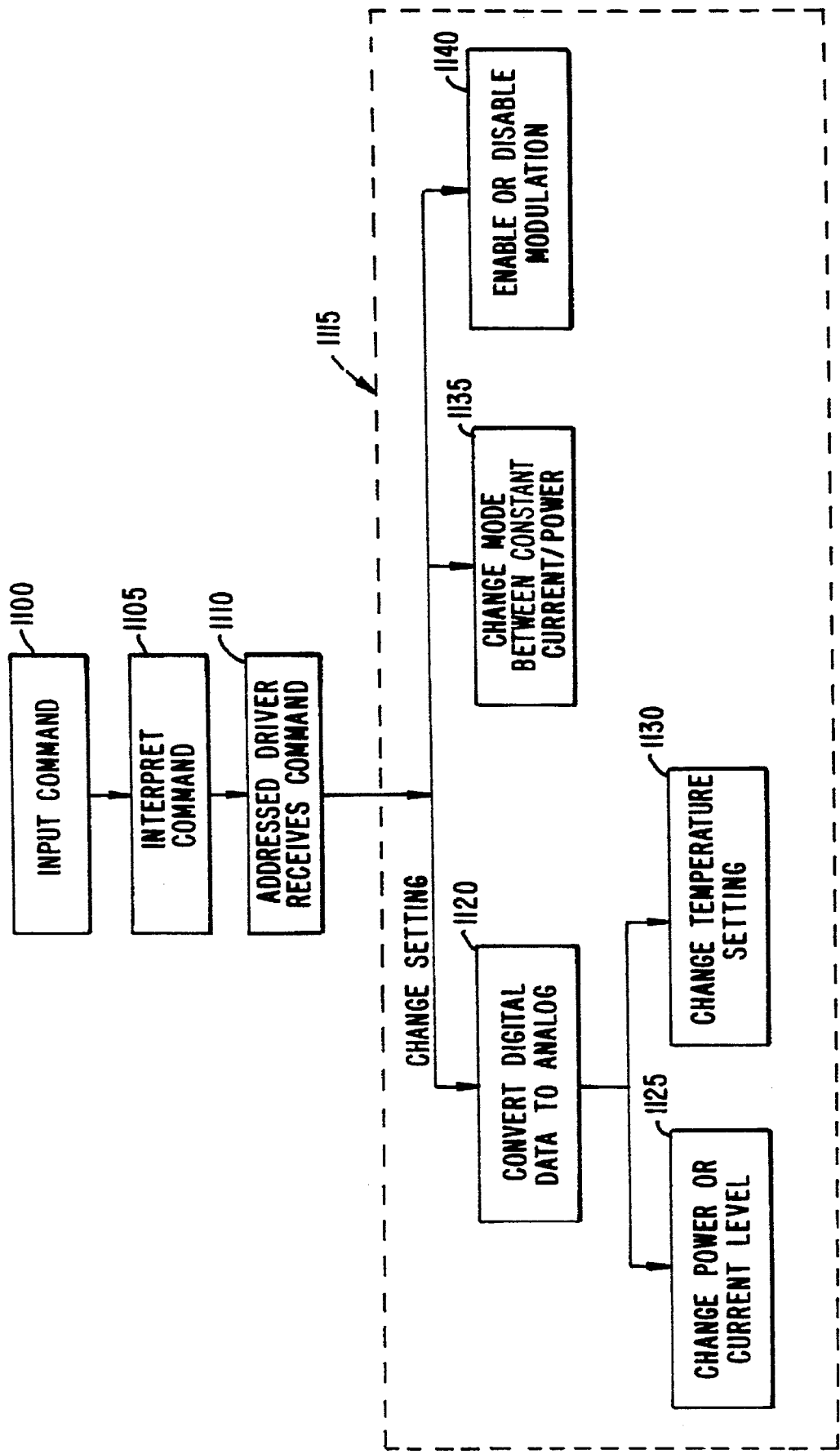
FIG. 11 is a flowchart of the steps the laser diode controller system of FIG. 1 takes in executing instructions.

FIG. 11 is a flowchart of the sequence of steps laser diode control system 100 undertakes in receiving, interpreting, and executing input commands. Basically, in step 1100 a command is input by a user through keypad 200 or from remote control unit 135. If the input command is from keypad 200 it is sent over backplane 120 to control module 105, while if it is input from remote control unit 135 it is input from either serial port 330 or IEEE 488 bus 335 to control module 105.

In either case the command is received at control module 105 and sent to microcontroller 300 through internal data bus 340. Microcontroller 300 interprets the command in step 1105 and generates appropriate control, data, and address signals. These signals are sent over backplane 120 to each of the laser diode driver modules. In step 1110 the addressed laser diode driver module receives the set of control and data signals, and in step 1115 the command is executed.

The steps taken in executing the command depend on the command itself and are described in more detail with respect to some of the more common commands listed below.

1. Current

To set the operating current of a particular laser diode 115[I], a user keys the appropriate laser diode number and the desired operational current through keypad 200 (step 1100). The entered information is sent over backplane 120 from keyboard 200 to control board 105 where microcontroller 300 creates the appropriate control signals, including an address signal addressing laser diode 115[I], to execute the set current command and a digital signal representing the desired current level (Step 1105).

The control signals are sent from control module 105 over backplane 120 to each laser diode control module 110[1] . . . [N]. Address decoder 505 in FPGA 405 of laser diode driver module 110[I] determines that the transmitted control signals are addressed for laser diode driver module 110[I] and sends an appropriate signal to data latch 510 to latch the new control signals (step 1110).

Since current is being set or changed, switch 705 is set to output the present level of current passing through laser diode 115[I] by a control signal on communication path 760. The desired current level signal is converted to analog form in step 1120. The desired current level is then input to current and power regulation circuit 430 over signal path 762 where it is compared to the actual (previously set) current level by differential amplifier 710. Any difference between the old and new operating current level is input to the base of transistor 715 which adjusts the operating current accordingly to complete execution of the set current level command of step 1125.

Figure 12:
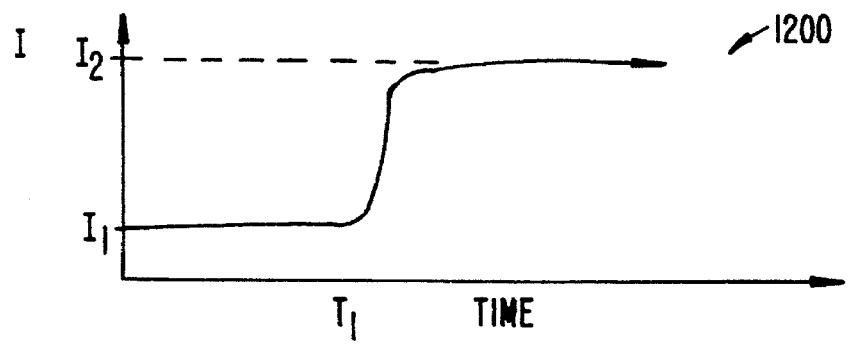
FIG. 12 is a diagram of the waveform of the current passing through a particular laser diode controlled by the laser diode controller system of FIG. 1 as the current level through the diode is switched from a first current level to a second current level.

FIG. 12 shows the waveform of the current passing through laser diode 115[I] as it is changed by an input command in step 1125. As shown in FIG. 12, when the operating current level of laser diode 115[I] is switched from an old level of $I_1$ to a new level $I_2$ at time $T_1$, waveform 1200, which is the current waveform of laser diode 115[I], slowly adjusts to the new level without producing noise or spikes. Since the reference current level is input to current and power stabilization circuit as an analog reference signal, waveform 1200 can be adjusted to the exact current level $I_2$ rather than some digital incremented current level near level $I_2$. Once the new current level is set, it is constantly regulated by the differential amplifier 710 to maintain the exact desired level.

2. Power

The power output of a particular laser diode can be changed in a manner similar to the manner in which the current level is changed except that a control signal for switch 705 is set to output the present operating power level of laser diode 115[I] as amplified by PGA 755 to differential amplifier 710 and the reference power level is input over signal path 762 to differential amplifier 710.

Figure 13:
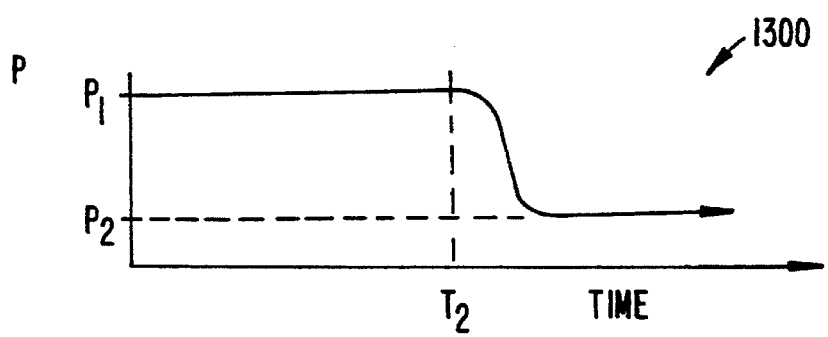
FIG. 13 is a diagram of the waveform of the output power of a laser diode controlled by the laser diode controller system of FIG. 1 as the diode output power level is switched from a first level to a second level.

FIG. 13 shows the waveform of the operating power level of laser diode 115[I] as it is decreased from level P2 to level P1 in response to a user command (waveform 1300). Similar to the change in operating current, the change in power is smoothed by current and power stabilization circuit 430 without apparent noise distorting the signal until it reaches exactly level $P_2$. Once the new operating power level is set, it is constantly regulated by differential amplifier 710 to maintain the exact desired level.

3. Temperature

To set or change the operating temperature of a particular laser diode 115[I], a user keys the appropriate laser diode number and the desired operational temperature through keyboard 200 (step 1100) in a manner similar to the manner described for setting either current or power level. The entered information is interpreted by microcontroller 300, which creates the appropriate control signals to execute the temperature setting command (Step 1105). The control signals are sent from control board over backplane 120 to each laser diode control module 110[1] . . . [N], and address decoder 505 in FPGA 405 of laser diode driver module 110[I] determines that the transmitted control signals are addressed for laser diode driver module 110[I], which allows data latch 510 to load the new control signals (step 1110).

The newly set operating temperature is input to differential amplifier 800 in temperature stabilization circuit 435 as the reference temperature, and the current (actual) operating temperature, as measured by thermistor 1010, is input to the second input of differential amplifier 800. Differential amplifier 800 outputs a signal to heat or cool the operating temperature of laser diode 115[I] as appropriate to the newly set temperature level.

Figure 14:
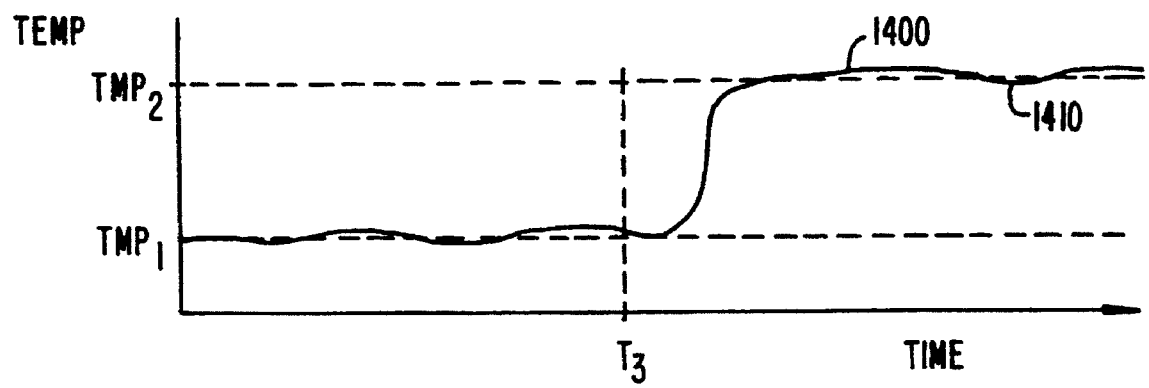
FIG. 14 is a diagram of the operating temperature of a particular laser diode controlled by the laser diode controller system of FIG. 1 as the operating temperature is switched from a first temperature to a second temperature.

FIG. 14 is a diagram showing the operating temperature of laser diode 115[I] as it is increased from a first temperature $TMP_1$ to a second temperature $TMP_2$ at time $T_3$. The slight delay shown in the diagram between setting the new temperature level and actually changing the temperature of the diode is introduced by capacitor 820. The delay introduced by capacitor 820 also serves to set the sensitivity level of temperature stabilization circuit 435 when it is regulating the operating temperature of a laser diode to ensure the diode's temperature is maintained constant.

At time $T_3$ when the reference temperature level on signal path 825 is increased from temperature $TMP_1$ to temperature $TMP_2$, differential amplifier outputs the difference between the newly set level $TMP_2$ and the current operating temperature output from amplifier 805. The output of amplifier 805 causes negative power supply 845 to start Peltier effect element 1015 to heat laser diode 115[I]. The laser diode is heated until it reaches temperature $TMP_2$.

Laser diode temperature can be maintained exactly when the cooling power is the same as the laser diode generated power. When the operating temperature is first set or charged, the temperature stabilization circuit may provide more heating or cooling current to the Peltier effect element, and because of the response time delay set by the capacitor 820, there will be overshoot and undershoot for a brief time. However, after a few minutes normally, the heating of the laser diode and cooling of thermal electrical cooler becomes balanced, and the temperature stabilizes.

B. Other Commands

Laser diode control system 100 also accepts commands to switch between a mode that regulates and stabilizes operating current of a laser diode and a mode that monitors, sets, and regulates operating power for a particular. This mode command can be entered through keypad 200 or through remote control unit 135 in step 1100. The entered information includes the laser diode number and the mode to operate under. Similar to the commands described above, microcontroller 300 generates appropriate control signals to carry out this command in step 1105, and the appropriate laser diode receives and decodes the command in step 1110.

In step 1135 the control signal input to switch 705 on communication path 760 is set so that the output of switch 705 is dependent on either the measured operating power (if the selected mode is power regulation) or operating current (if the selected mode is current regulation) of laser diode 115[I].

A command can also be entered in step 1100 to enable and disable modulation. The modulation frequency and depth can be programmed from keypads or remote command. Microcontroller 300 sends information to driver module 110(I) that is decoded by FPGA 405. FPGA 405 generates the modulation control square wave signal. This signal selects the ON and OFF laser diode current level at the programmed frequency. The control signal can be output to the input of an external pulse locked power meter for frequency lock purposes allowing peak power to be measured. The modulation control signal can also be switched to take an external pulse train from a function or pattern generator.

Having fully described the preferred embodiment of the present invention, many other equivalent or alternative methods of implementing the laser diode control system of the present invention will be apparent to those skilled in the art. These equivalents and alternatives are intended to be included within the scope of the present invention.

What is claimed is:

1. A system for controlling operation of a plurality of laser diodes, said system comprising:

(a) parameter setting means for setting operating temperature, current, and power levels for first and second laser diodes;

(b) a control unit, coupled to said parameter setting means, for generating control and data signals in response to said parameter setting means, said control unit generating a first set of control and data signals to control said first laser diode and a second set of control and data signals to control said second laser diode;

(c) a first laser diode driver, disposed on a first circuit board, for driving said first laser diode in response to said first set of control signals, said first laser diode driver module including:

i) first low power control means for interpreting said first set of control signals to control said first laser diode;

ii) a first digital-to-analog converter, coupled to said digital control means, for converting said first set of digital data signals to a first set of analog data signals;

iii) first laser diode regulating means for regulating and stabilizing operation of said first laser diode according to said first set of analog data signals, said first laser diode regulating means including:
a temperature stabilization circuit for setting and stabilizing operation of the first laser diode at a temperature level set by said first set of analog data signals, and
a current and power stabilization circuit for setting and stabilizing operation of the first laser diode at a current level and power level set by said first set of analog data signals;

(d) a second laser diode driver unit for driving a second laser diode in response to said second set of control and data signals, said second laser diode driver module including:
i) second low power control means for interpreting said second set of control signals to control said second laser diode;
ii) a second digital-to-analog converter, coupled to said digital control means, for converting said second set of digital data signals to a second set of analog data signals;
iii) second laser diode regulating means for regulating and stabilizing operation of said second laser diode according to said second set of analog data signal, said second laser diode regulating means including:
a second temperature stabilization circuit for setting and stabilizing operation of the second laser diode at a temperature level set by said second set of analog data signals, and
a second current and power stabilization circuit for setting and stabilizing operation of the second laser diode at a current level and power level set by said second set of analog data signals wherein said first set of digital data and control signals are transmitted on a first layer of said first circuit board and said first set of analog data signals are transmitted on a second layer of said first circuit board different than said first layer.

2. The system for controlling a plurality of laser diodes set forth in claim 1 wherein said second laser diode driver module is disposed on a second circuit board and said second set of digital data and control signals are transmitted on a first layer of said second circuit board and said second set of analog data signals are transmitted on a second layer of said second circuit board different than said first layer.

3. A system for controlling operation of a plurality of laser diodes, said system comprising:

(a) parameter setting means for setting operating temperature, current, and power levels for first and second laser diodes;

(b) a control unit, coupled to said parameter setting means, for generating control and data signals in response to said parameter setting means, said control unit generating a first set of control and data signals to control said first laser diode and a second set of control and data signals to control said second laser diode;

(c) a first laser diode driver for driving said first laser diode in response to said first set of control signals, said first laser diode driver module including:
i) first low power control means for interpreting said first set of control signals to control said first laser diode;
ii) a first digital-to-analog converter, coupled to said digital control means, for converting said first set of digital data signals to a first set of analog data signals;

iii) first laser diode regulating means for regulating and stabilizing operation of said first laser diode according to said first set of analog data signals, said first laser diode regulating means including:
a temperature stabilization circuit for setting and stabilizing operation of the first laser diode at a temperature level set by said first set of analog data signals, and
a current and power stabilization circuit for setting and stabilizing operation of the first laser diode at a current level and power level set by said first set of analog data signals;

(d) a second laser diode driver unit for driving a second laser diode in response to said second set of control and data signals, said second laser diode driver module including:
i) second low power control means for interpreting said second set of control signals to control said second laser diode;
ii) a second digital-to-analog converter, coupled to said digital control means, for converting said second set of digital data signals to a second set of analog data signals;
iii) second laser diode regulating means for regulating and stabilizing operation of said second laser diode according to said second set of analog data signals, said second laser diode regulating means including:
a second temperature stabilization circuit for setting and stabilizing operation of the second laser diode at a temperature level set by said second set of analog data signals, and
a second current and power stabilization circuit for setting and stabilizing operation of the second laser diode at a current level and power level set by said second set of analog data signals, (e) a signal channel, coupled to said control unit, said first laser diode driver, and said second laser diode driver, for transmitting said first and second sets of control and data signals between said control unit and said first and second laser diode drivers and for supplying said first and second laser diode drivers with a power supply signal;

wherein said first low power control means comprises a field programmable gate array which presents a single load to said power supply signal.

4. The system for controlling a plurality of laser diodes set forth in claim 3 wherein said second low power control means comprises a second field programmable gate array which presents a single load to said power supply signal.

5. The system for controlling a plurality of laser diodes set forth in claim 4 wherein said second low power control means comprises a second field programmable gate array which presents a single load to said power supply signal.

6. The system for controlling a plurality of laser diodes as set forth in claim 5 wherein said parameter setting means comprises a keypad coupled to said signal channel.

7. The system for controlling a plurality of laser diodes as set forth in claim 5 wherein said parameter setting means comprises a remote processing unit.

8. A system for controlling operation of a plurality of laser diodes, said system comprising:

(a) parameter setting means for setting operating temperature, current, and power levels for first and second laser diodes;

(b) a control unit, coupled to said parameter setting means, for generating control and data signals in response to said parameter setting means, said control unit generating a first set of control and data signals to control said first laser diode and a second set of control and data signals to control said second laser diode;

(c) a first laser diode driver for driving said first laser diode with a first modulation signal in response to said first set of control signals, said first laser diode driver module including:

i) first low power control means for interpreting said first set of control signals to control said first laser diode;

ii) a first digital-to-analog converter, coupled to said digital control means, for converting said first set of digital data signals to a first set of analog data signals;

iii) first laser diode regulating means for regulating and stabilizing operation of said first laser diode according to said first set of analog data signals, said first laser diode regulating means including:

a temperature stabilization circuit for setting and stabilizing operation of the first laser diode at a temperature level set by said first set of analog data signals, and a current and power stabilization circuit for setting and stabilizing operation of the first laser diode at a current level and power level set by said first set of analog data signals;

iv) frequency setting means for setting a frequency of said first modulation signal;

v) voltage setting means for setting a minimum and maximum voltage level for said first modulation signal; and vi) signal generating means, coupled to said frequency setting means and to said voltage level setting means, for generating said first modulation signal to pulsate at said frequency set by said frequency setting means between said minimum and maximum voltage levels set by said voltage setting means, said signal generating means comprising a switch having:

1) a first input coupled to a first signal path on which said minimum voltage level is set by said voltage setting means;

2) a second input coupled to a second signal path on which said maximum voltage level is set by said voltage setting means; and 3) a control input, coupled to said frequency setting means;

wherein said switch switches between said first and second inputs at said set frequency to produce said modulation signal;

(d) a second laser diode driver unit for driving a second laser diode with a second modulation signal in response to said second set of control and data signals, said second laser diode driver module including:

i) second low power control means for interpreting said second set of control signals to control said second laser diode;

ii) a second digital-to-analog converter, coupled to said digital control means, for converting said second set of digital data signals to a second set of analog data signals;

iii) second laser diode regulating means for regulating and stabilizing operation of said second laser diode according to said second set of analog data signals, said second laser diode regulating means including:

a second temperature stabilization circuit for setting and stabilizing operation of the second laser diode at a temperature level set by said second set of analog data signal, and a second current and power stabilization circuit for setting and stabilizing operation of the second laser diode at a current level and power level set by said second set of analog data signals;

iv) second frequency setting means for setting a second frequency for said second modulation signal;

v) second voltage setting means for setting a minimum and maximum voltage level for said second modulation signal; and vi) second signal generating means, coupled to said second frequency setting means and to said second voltage level setting means, for generating said second modulation signal to pulsate at said second frequency set by said frequency setting means between said minimum and maximum voltage levels set by said voltage setting means.

9. The apparatus of claim 8 wherein said first signal generating means comprises a switch that allows an external signal source to set said frequency of said first modulation signal.

* * * * *